(12) United States Patent
Shin et al.

(10) Patent No.: US 10,020,425 B2
(45) Date of Patent: Jul. 10, 2018

(54) LIGHT-EMITTING DIODE AND METHOD FOR MANUFACTURING SAME

(71) Applicant: Seoul Semiconductor Co., Ltd., Ansan-si (KR)

(72) Inventors: Chan Seob Shin, Ansan-si (KR); Hyoung Jin Lim, Ansan-si (KR); Kyoung Wan Kim, Ansan-si (KR); Yeo Jin Yoon, Ansan-si (KR); Jacob J Richardson, Ansan-si (KR); Daniel Estrada, Ansan-si (KR); Evan C. O'Hara, Ansan-si (KR); Haoran Shi, Ansan-si (KR)

(73) Assignee: Seoul Semiconductor Co., Ltd., Ansan-si (KR)

( * ) Notice: Subject to any disclaimer, the term of this patent is extended or adjusted under 35 U.S.C. 154(b) by 47 days.

(21) Appl. No.: 14/759,603

(22) PCT Filed: Sep. 25, 2013

(86) PCT No.: PCT/KR2013/008598
§ 371 (c)(1),
(2) Date: Nov. 20, 2015

(87) PCT Pub. No.: WO2014/109454
PCT Pub. Date: Jul. 17, 2014

(65) Prior Publication Data
US 2016/0218244 A1      Jul. 28, 2016

(30) Foreign Application Priority Data

Jan. 8, 2013  (KR) ................ 10-2013-0001877

(51) Int. Cl.
*H01L 33/42* (2010.01)
*H01L 33/60* (2010.01)
*H01L 33/46* (2010.01)

(52) U.S. Cl.
CPC .............. *H01L 33/42* (2013.01); *H01L 33/60* (2013.01); *H01L 33/46* (2013.01); *H01L 2933/0016* (2013.01); *H01L 2933/0058* (2013.01)

(58) Field of Classification Search
CPC ......... H01L 33/42; H01L 33/60; H01L 33/46; H01L 2933/0016; H01L 2933/0058
See application file for complete search history.

(56) References Cited

U.S. PATENT DOCUMENTS 6,380,564 B1    4/2002   Chen et al.
8,093,607 B2 *  1/2012   Eichler ................ H01L 33/465
                                                          257/98
(Continued)

FOREIGN PATENT DOCUMENTS

JP      2008-192710        8/2008
KR   10-2005-0031602       4/2005
(Continued)

OTHER PUBLICATIONS

Matthias Batzill, Ulrike Diebold, The surface and materials science of tin oxide, Progress in Surface Science, vol. 79, Issues 2-4, 2005, pp. 47-154.*

(Continued)

*Primary Examiner* — Mark Tornow
(74) *Attorney, Agent, or Firm* — H.C. Park & Associates, PLC

(57) ABSTRACT

A light-emitting diode includes, a semiconductor stack including a first semiconductor layer, a second semiconductor layer, and an active layer. The light-emitting diode also includes a transparent conductive layer including a first transparent conductive layer disposed on the second semiconductor layer and a second transparent conductive layer disposed on the first transparent conductive layer. The (Continued)

second transparent conductive layer has a conductivity different than the first transparent conductive layer.

9 Claims, 6 Drawing Sheets

(56) References Cited

U.S. PATENT DOCUMENTS

| | | | |
|---|---|---|---|
| 8,304,803 B2* | 11/2012 | Tanaka | H01L 33/42 257/103 |
| 2005/0067623 A1 | 3/2005 | Ha et al. | |
| 2008/0185606 A1 | 8/2008 | Sano et al. | |
| 2008/0241526 A1 | 10/2008 | Ou et al. | |
| 2009/0315065 A1* | 12/2009 | Komada | H01L 33/42 257/99 |

FOREIGN PATENT DOCUMENTS

| | | |
|---|---|---|
| KR | 10-2008-0089234 | 10/2008 |
| KR | 10-2012-0108666 | 10/2012 |

OTHER PUBLICATIONS

H.T. Cao, Z.L. Pei, J. Gong, C. Sun, R.F. Huang, L.S. Wen, Preparation and characterization of Al and Mn doped ZnO (ZnO: (Al, Mn)) transparent conducting oxide films, Journal of Solid State Chemistry, vol. 177, Issue 4, 2004, pp. 1480-1487.*

Minhong Jiang, Xinyu Liu, Hua Wang, Conductive and transparent Bi-doped ZnO thin films prepared by rf magnetron sputtering, Surface and Coatings Technology, vol. 203, Issue 24, Sep. 15, 2009, pp. 3750-375.*

International Search Report dated Jan. 2, 2014, in International Application No. PCT/KR2013/008598.

* cited by examiner

LIGHT-EMITTING DIODE AND METHOD FOR MANUFACTURING SAME

CROSS-REFERENCE TO RELATED APPLICATIONS

This application is the National Stage Entry of International Application No. PCT/KR2013/008598, filed on Sep. 25, 2013, and claims priority from and the benefit of Korean Patent Application No. 10-2013-0001877, filed on Jan. 8, 2013, each of which is hereby incorporated by reference for all purposes as if fully set forth herein.

BACKGROUND

Field

The present invention relates to a light emitting diode and, more particularly, to a light emitting diode that includes a transparent conductive layer facilitating current spreading, and a method for manufacturing the same.

Discussion of the Background

Recent developments of various display devices have increasingly attracted attention to transparent materials suited for light transmission characteristics. A display device converts electric signals into light and thus employs a plurality of electrodes in order to transfer the electric signals. Since opaque electrodes block light and thus reduce visibility, it is necessary to provide transparent electrodes that can secure both transparency and electrical conductivity.

Such a transparent electrode can exhibit transparency in the visible wavelength range when having an energy band gap of 2.5 eV or more. That is, since light in the wavelength range of blue light to UV light has shorter wavelengths and higher energy, a transparent electrode having a smaller energy band gap cannot transmit light from blue light to UV light which are in the wavelength range of higher energy. Accordingly, in order to transmit light from blue light to UV light in the wavelength range of higher energy, a material having a larger energy band gap is employed as the transparent electrodes. Among such conductive materials exhibiting transparency, ITO has a larger energy band gap.

ITO is an acronym of indium tin oxide. Since ITO exhibits high electrical conductivity, has a band gap of about 4.3 eV and a larger work function, exhibits good light transmittance in the visible wavelength, and allows an easy patterning process, ITO is easy to use in manufacture of displays or light emitting diodes.

Thereamong, a light emitting diode can be formed with a plurality of semiconductor layers including a light emitting layer, wherein one of the semiconductor layers adjoins an electrode through which light emitting signals are input. Here, since the semiconductor layer has higher specific resistance than the electrode, there is difficulty in ohmic contact therebetween.

Thus, a transparent electrode layer for ohmic contact may be further formed between the semiconductor layer and the electrode. In other words, the transparent electrode layer may be interposed therebetween in order to reduce contact resistance between the semiconductor layer and the electrode.

Moreover, since the transparent electrode layer is required to transmit light emitted from the light emitting layer, it is necessary for the transparent electrode layer to exhibit transparency. ITO exhibiting transparency and electrical conductivity is generally used as a material for the transparent electrode layer.

However, when the transparent electrode layer is thickly formed using ITO, a large thickness of ITO can cause increase in light loss due to rapid decrease in light transmittance and increase in light absorption rate thereof.

On the other hand, when the transparent electrode layer is thinly formed using ITO in order to prevent light absorption, contact resistance becomes unstable due to unstable ohmic contact between the transparent electrode layer and the semiconductor layer, thereby causing increase in operation voltage due to local current crowding and increase in forward voltage.

Moreover, ITO has problems such as high material costs due to use of indium (In) as a main raw material and operation instability caused by high reducing properties of indium (In) and tin (Sn) in hydrogen plasma by diffusion of indium (In).

SUMMARY

Embodiments of the invention provide a light emitting diode that includes a transparent conductive layer having no thickness restriction on a semiconductor layer to improve light extraction efficiency.

Embodiments of the invention provide a light emitting diode that can reduce operation voltage through a structure enabling current spreading while reducing electric resistance.

In accordance with one aspect of the present invention, a light emitting diode has a semiconductor stack in which a first semiconductor layer, an active layer and a second semiconductor layer are stacked, and includes a transparent conductive layer including a first transparent conductive layer formed on the second semiconductor layer and a second transparent conductive layer formed on the first transparent conductive layer and having different electrical conductivity than the first transparent conductive layer.

The light emitting diode may further include a first electrode connected to the first semiconductor layer and a second electrode formed on the second transparent conductive layer.

The first transparent conductive layer and the second transparent conductive layer may be formed of the same kind of material and have different thicknesses.

The transparent conductive layer may include an electrically conductive area that the first transparent conductive layer and the second semiconductor layer adjoin, and a resistive area that the second transparent conductive layer and the second semiconductor layer adjoin.

The resistive area may include a distributed Bragg reflector (DBR) layer interposed between the second transparent conductive layer and the second semiconductor layer.

The DBR layer may be formed by alternately stacking two kinds of media having different indices of refraction and may be formed of a material selected from among $SiO_x$, $SiN_x$, $Si_xN_y$, $SiON_x$, $SiO_2$, $TiO_2$, $Nb_2O_5$, $HfO_2$ and compounds thereof.

The DBR layer may have one shape selected from among hexagonal, octagonal, circular shapes, and combinations thereof.

The DBR layer may be formed on a lower side of the second electrode.

The transparent conductive layer may include the first transparent conductive layer and the second transparent conductive layer formed on the first transparent conductive layer by doping an impurity into the same kind of material as the first transparent conductive layer, and the first transparent conductive layer and the second transparent conductive layer may have different electrical conductivities.

The impurity may include at least one of Group I, V, III, and VII elements.

The first transparent conductive layer may have the same size as the second electrode.

The transparent conductive layer may include the first transparent conductive layer and the second transparent conductive layer formed on the first transparent conductive layer using a compound prepared by adding a heterogeneous material to the same kind of material as the first transparent conductive layer; the first transparent conductive layer and the second transparent conductive layer may have different electrical conductivities; and the first and second transparent conductive layers may be repeatedly formed plural times.

The heterogeneous material may include one of Group II elements including Mg, Ca, Be and Cd, and compounds thereof, which adjust an energy band gap of the second transparent conductive layer.

Alternatively, the heterogeneous material may include one of Group VI elements Cr, Mo, W, Se and Te, and compounds thereof, which adjust an energy band gap of the second transparent conductive layer.

In accordance with another aspect of the present invention, a method for manufacturing a light emitting diode includes: forming a semiconductor stack by sequentially stacking a first semiconductor layer, an active layer, a second semiconductor layer on a substrate; forming a first transparent conductive layer on the second semiconductor layer; forming a second transparent conductive layer on the first transparent conductive layer; and forming electrodes on the semiconductor stack having the second transparent conductive layer formed therein.

The method may further include, after forming the semiconductor stack, forming a mesa structure by mesa etching the semiconductor stack; forming a passivation layer on the semiconductor stack of the mesa structure; applying a photoresist to the passivation layer; and exposing the second semiconductor layer by removing the photoresist and the passivation layer.

Forming the first transparent conductive layer may include: preparing a first aqueous solution, a second aqueous solution, and the semiconductor stack having the second semiconductor layer exposed thereon; dipping the semiconductor stack in the first aqueous solution to allow $Zn^-$ ions to be adsorbed to the second semiconductor layer; cleaning the semiconductor stack to which the $Zn^-$ ions are adsorbed; and dipping the semiconductor stack to which the $Zn^-$ ions are adsorbed in the second aqueous solution to form the first transparent conductive layer in a monolayer structure.

The first aqueous solution may be an aqueous solution in which the $Zn^-$ ions are dissolved.

The second aqueous solution may be DI water.

Forming the first transparent conductive layer may be repeatedly performed to form a plurality of first transparent conductive layers each having the monolayer structure.

The method may further include, after forming the first transparent conductive layer, forming a resistive area by etching the first transparent conductive layer to expose the second semiconductor layer.

The method may further include forming a DBR layer in the resistive area.

The method may further include, after forming the second transparent conductive layer, repeatedly forming the first transparent conductive layer and the second transparent conductive layer.

The method may further include, after forming the second transparent conductive layer, exposing a surface of the second transparent conductive layer, followed by performing surface treatment of the second transparent conductive layer.

The method may further include, after forming the electrode, exposing a surface of the second transparent conductive layer, followed by performing surface treatment of the second transparent conductive layer.

According to embodiments of the invention, the light emitting diode can reduce sheet resistance and contact resistance through formation of a high quality transparent conductive layer, can reduce operation voltage through improvement in electron mobility, and can improve luminous efficacy by facilitating current spreading.

In addition, since the transparent conductive layer can be stacked regardless of thickness thereof, a light extraction pattern including a light reflecting pattern can be freely formed, thereby improving light extraction efficiency.

DETAILED DESCRIPTION OF THE ILLUSTRATED EMBODIMENTS

Figure 1:
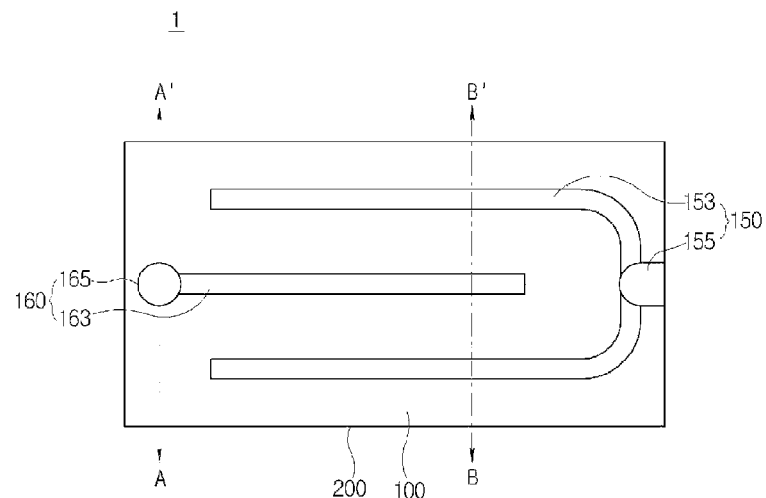
FIG. 1 is a plan view of a light emitting diode according to one embodiment of the present invention.

Hereinafter, embodiments of the present invention will be described in more detail with reference to the accompanying drawings. The following embodiments are provided by way of example so as to fully convey the spirit of the present disclosure to those skilled in the art to which the present disclosure pertains. Accordingly, the present disclosure is not limited to the embodiments disclosed herein and may also be implemented in different forms. In the drawings, widths, lengths, thicknesses, and the like of elements may be exaggerated for clarity and descriptive purposes. When an element or layer is referred to as being "placed on" or "disposed on" another element or layer, it may be directly "placed on" or "disposed on" the other element or layer or intervening elements or layers may be present. Throughout the specification, like reference numerals denote like elements having the same or similar functions.

First, a nitride-based light emitting diode according to embodiments of the invention will be described with reference to FIGS. 1, 2, 3, 4, 5, 6, 7, 8, 9, 10, 11, and 12. Although a light emitting diode including a gallium nitride (GaN) based semiconductor is described in these embodiments, the present invention is not limited thereto and various nitride-based semiconductors may be used.

Figure 2:
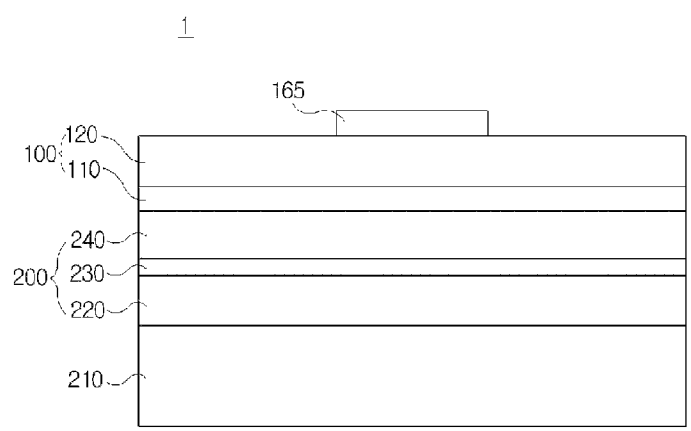
FIG. 2 is a sectional view taken along line A-A' of FIG. 1.

FIG. 1 is a plan view of a light emitting diode according to one embodiment of the present invention and FIG. 2 is a sectional view taken along line A-A' of FIG. 1.

Referring to FIG. 1 and FIG. 2, a light emitting diode 1 according to one embodiment may include a semiconductor stack 200, which is formed on a substrate 210 and includes a first semiconductor layer 220, a second semiconductor layer 240 and an active layer 230 formed between the first and second semiconductor layers 220, 240, and further includes a transparent conductive layer 100 formed on the semiconductor stack 200. The light emitting diode may further include a first electrode 150 formed on the first semiconductor layer 220 and a second electrode 160 formed on the second semiconductor layer 240.

The substrate 210 may be a growth substrate such as a sapphire substrate, an AlN substrate, a GaN substrate, a SiC substrate, or a Si substrate, and may be any substrate so long as the substrate allows growth of a nitride-based semiconductor thereon.

In the semiconductor stack 200, the first semiconductor layer 220, the active layer 230 and the second semiconductor layer 240 are sequentially grown and may be formed of nitride-based semiconductors. For example, the nitride-based semiconductor may include a binary nitride-based semiconductor such as undoped GaN or InN, a ternary nitride-based semiconductor such as AlGaN or InGaN, and a quaternary nitride-based semiconductor such as AlInGaN. The first semiconductor layer or the second semiconductor layer may be an n-type or p-type semiconductor layer, or an undoped nitride-based semiconductor.

In addition, the light emitting diode 1 includes the first electrode 150 on the first semiconductor layer 220 and the second electrode 160 on the second semiconductor layer 240. The first electrode 150 and the second electrode 160 transfer input signals to the active layer 230 of the semiconductor stack. In response to the input signals, the active layer 230 generates light through recombination of electrons and holes.

Here, the first electrode 150 and the second electrode 160 include a plurality of elongated electrodes 153, 163 which extend to electrode pads 155, 165 for current spreading, respectively, and are in the area of the first and second semiconductor layers 220, 240.

Further, the transparent conductive layer 100 is formed on the semiconductor stack 200 to transmit light emitted from the active layer 230 while allowing electric current input through the first and second electrodes 150, 160 to uniformly spread in the semiconductor stack 200.

Referring again to FIG. 2, the transparent conductive layer 100 is formed on the second semiconductor layer 240. The transparent conductive layer 100 may be formed of zinc oxide (ZnO) having a large energy band gap and exhibiting high electrical conductivity.

Zinc oxide (ZnO) is a transparent conductive material that corresponds to an n-type semiconductor having an energy band gap of about 3.4 eV and has many advantages when used as a photoelectric material. In addition, since zinc oxide (ZnO) allows easy doping and has a narrow conduction band, optical properties of zinc oxide can be easily adjusted depending upon doping materials. Such zinc oxide can be easily produced at low cost and can be used as a transparent conductive material due to high light transmittance and electrical conductivity thereof. Furthermore, zinc oxide (ZnO) can exhibit n-type semiconductor characteristics without doping due to defects such as interstitial Zn atoms, oxygen vacancy, and the like.

On the other hand, zinc oxide (ZnO) and gallium nitride (GaN) have similar characteristics. That is, ZnO and GaN have band gaps of 3.36 eV and 3.39 eV at room temperature, respectively, and both materials have a hexagonal close-packed (wurzite) structure and similar lattice parameters to reduce surface resistance while improving electron mobility. With large band gap energy, gallium nitride (GaN) and zinc oxide (ZnO) have applicability as devices capable of emitting or receiving light in the blue light or UV wavelength band. Particularly, zinc oxide (ZnO) has a very high exciton binding energy of 60 meV at room temperature and can secure stability as a light emitting device at room temperature.

The transparent conductive layer 100 formed of zinc oxide includes a first transparent conductive layer 110 and a second transparent conductive layer 120. In addition, the second transparent conductive layer 120 may be formed to a larger thickness than the first transparent conductive layer 110. Here, the first transparent conductive layer 110 may be formed to a thickness of 80 nm to 120 nm.

The first transparent conductive layer 110 is formed on the second semiconductor layer 240 and has higher electrical conductivity than the second transparent conductive layer 120. Here, the first transparent conductive layer 110 may be an n-type semiconductor layer and the second transparent semiconductor layer 120 may be a p-type semiconductor layer, or vice versa.

Further, in formation of the transparent conductive layer 100, the first transparent conductive layer 110 may act as a nucleus layer for growing the second transparent conductive layer 120. On the other hand, an ohmic contact layer may be formed between the first transparent conductive layer 110 and the second semiconductor layer 240 through heat treatment at 500° C. under a nitrogen atmosphere. Further, after formation of the second transparent conductive layer 120 on the first transparent conductive layer 110, heat treatment may be performed to improve adhesion between the first transparent conductive layer 110 and the second transparent conductive layer 120.

In this way, the transparent conductive layer 100 formed of zinc oxide allows light transmission even through a thick layer and can reduce operation voltage at low resistance. Further, it is possible to reduce manufacturing costs due to low material cost by use of zinc (Zn) which is an abundant natural resource.

Figure 3:
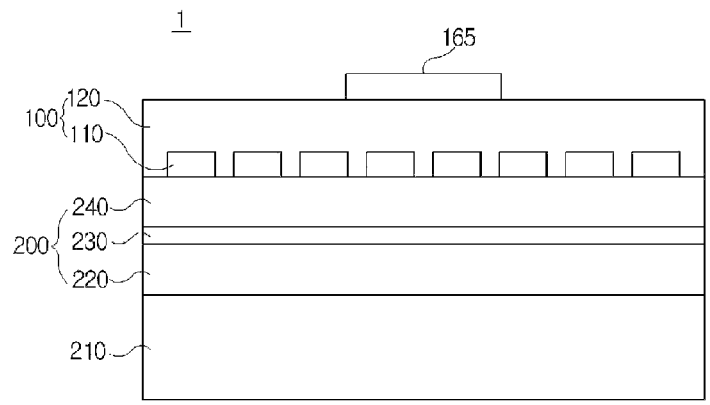
FIG. 3 is a sectional view of a light emitting diode according to a first embodiment of the present invention.

FIG. 3 is a sectional view of a light emitting diode according to a first embodiment of the invention. Herein, FIG. 1 and FIG. 2 will also be referred to in description of the light emitting diode according to the first embodiment.

Referring to FIG. 3, the transparent conductive layer 100 is formed on the semiconductor stack 200. More specifically, the first transparent conductive layer 110 adjoins the second semiconductor layer 240 of the semiconductor stack 200. Further, the second transparent conductive layer 120 is formed on the first transparent conductive layer 110 to cover the first transparent conductive layer 110.

Here, the first transparent conductive layer 110 is patterned in a predetermined shape. The second semiconductor layer 240 is exposed through an exposing area of the first transparent conductive layer formed by patterning. Here, the first transparent conductive layer 110 may be patterned in a triangular shape, a diamond shape, a hexagonal shape, an octagonal shape, or the like.

Since the first transparent conductive layer 110 has higher electrical conductivity than the second semiconductor layer 240, the first transparent conductive layer 110 may correspond to an electrically conductive area EA and an exposed area of the second semiconductor layer 240 having relatively high resistance may correspond to a resistive area RA.

On the other hand, when supplied from the electrodes 150, 160, electric current flows to the second semiconductor layer 240 through the second transparent conductive layer 120 and the first transparent conductive layer 110. Then, the active layer 230 generates light through recombination of electrons and holes supplied by the electric current flowing to the second semiconductor layer 240.

Here, when supplied to the second semiconductor layer 240, electric current must evenly spread in the second semiconductor layer 240 before being supplied to the active layer 230. However, the second semiconductor layer 240 has high specific resistance, thereby causing non-uniform delivery of electric current. As a result, such current crowding can cause deterioration in luminous efficacy.

According to the present invention, the first transparent conductive layer 110 is patterned to divide the electrically conductive area EA and the resistive area RA for current spreading, whereby electric current can evenly spread in the second semiconductor layer 240.

Here, the first transparent conductive layer 110 may be formed to have higher electrical conductivity than the second transparent conductive layer 120. Accordingly, since electric current supplied from the second transparent conductive layer 120 tends to flow towards a lower resistance side, the electric current will flow to the first transparent conductive layer 110 having low resistance. In other words, since the electrically conductive area EA occupies a large area to allow electric current to easily flow towards the electrically conductive area EA, current crowding can be relieved through the electrically conductive area EA distributed over a large area. Accordingly, electric current can evenly spread in the second semiconductor layer 240 due to the first transparent conductive layer 110 formed in the electrically conductive area EA.

In this way, current spreading can be easily achieved by patterning the first transparent conductive layer 110 to form the electrically conductive area EA having low resistance, thereby improving luminous efficacy of the light emitting diode 1.

Figure 4A:
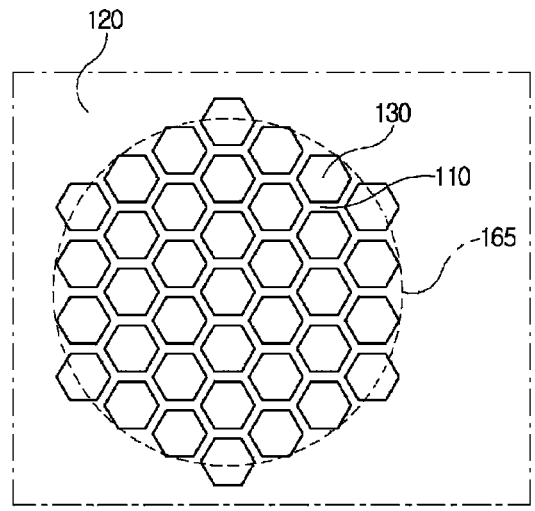
FIG. 4a is a plan view of a light emitting diode according to a second embodiment of the present invention.
Figure 4B:
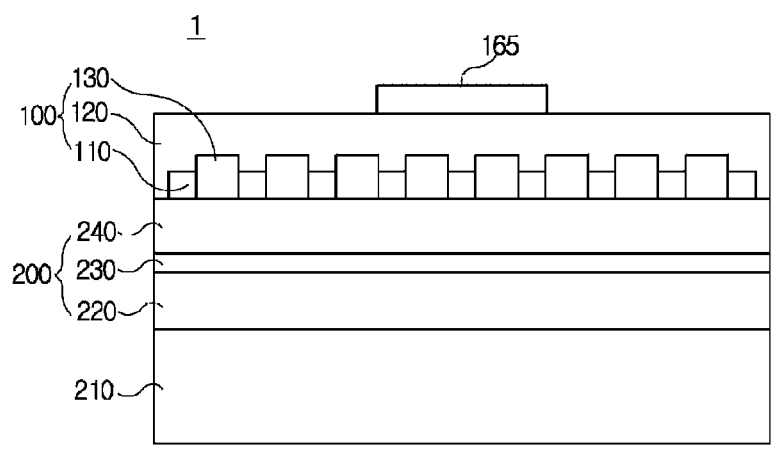
FIG. 4b is a sectional view of a light emitting diode according to the second embodiment of the present invention.

FIG. 4a is a plan view of a light emitting diode according to a second embodiment of the present invention, and FIG. 4b is a sectional view of a light emitting diode according to the second embodiment of the present invention. Herein, FIG. 1 to FIG. 3 will also be referred to for convenience in description of the light emitting diode according to the second embodiment.

Referring to FIG. 4a and FIG. 4b, a DBR layer 130 is formed in the resistive area RA of the light emitting diode according to the first embodiment shown in FIG. 3.

The DBR layer 130 may be defined as a non-luminous area, which is formed under the pad electrode 165 of the second electrode 160 and the elongated electrode 163 extending from the pad electrode 165. An area having the electrodes formed therein blocks light emitted from a light emitting layer. However, a reflector is provided to the area having the electrodes formed therein to form a reflective area, thereby improving light extraction efficiency. In addition, as shown in FIG. 2 and FIG. 3, the first transparent conductive layer 110 may be formed in an area defined as a luminous area.

An area in which the first transparent conductive layer 110 is formed may correspond to the electrically conductive area EA and an area in which the DBR (Distributed Bragg Reflector: 130) layer is formed may correspond to the resistive area RA. Preferably, a surface adjoining the second transparent conductive layer 120 on the first transparent conductive layer 110 formed in the electrically conductive area EA has a size of about 1 μm.

In addition, the DBR layer 130 may be formed in a triangular shape, a diamond shape, a hexagonal shape, or an octagonal shape through patterning. The DBR layer preferably has a diameter of about 5 μm.

The DBR layer 130 may be formed by alternately stacking, for example, two or more insulation layers having different indices of refraction so as to act as a distributed Bragg reflector (DBR). The DBR layer 130 is used to secure high reflectivity for various light emitting diodes having a light emitting function, a light detection function, a light modification function, and the like.

The DBR layer 130 is a reflective mirror which is formed by alternately stacking two kinds of media having different indices of refraction and serves to reflect light based on a difference between the indices of refraction. The DBR layer 130 may be composed of insulation materials selected from among, for example, $SiO_x$, $SiN_x$, $Si_xN_y$, $SiON_x$, $SiO_2$, $TiO_2$, $Nb_2O_5$, and $HfO_2$, and formed by, for example, chemical vapor deposition or sputtering.

In this way, the DBR layer 130 acting as a reflective layer reflects light, which has passed through the semiconductor stack 200, to improve light extraction efficiency of the light emitting diode 1, and allows electric current to spread evenly, thereby preventing deterioration of the light emitting diode 1.

On the other hand, in formation of the second transparent conductive layer 120, first, the first transparent conductive layer 110 is subjected to patterning, and the DBR layer 130 is formed on the second semiconductor layer 240. In addition, the second transparent conductive layer 120 is formed by epitaxial lateral overgrowth (ELO) using the first transparent conductive layer 110 as a nucleus layer. Here, the second transparent conductive layer 120 grown on the first transparent conductive layer 110 by epitaxial lateral overgrowth may be formed to completely cover the DBR layer 130 and the first transparent conductive layer 110.

The second transparent conductive layer 120 grown by epitaxial lateral overgrowth minimizes defects, thereby forming a high quality transparent conductive layer 100 with improved crystallinity. Such a second transparent conductive layer 120 with high quality increases electron mobility while reducing surface resistance and contact resistance. In addition, an area in which the second transparent conductive layers are grown to meet each other through epitaxial lateral overgrowth may allow more efficient current flow than other areas. This structure can improve vertical current flow to the second transparent conductive layer 120 and the first transparent conductive layer 110.

As such, the high quality transparent conductive layer 100 is formed by forming the second transparent conductive layer 120 through epitaxial lateral overgrowth to reduce surface resistance and contact resistance, whereby operation voltage of the light emitting diode 1 can be reduced through improvement in electron mobility.

In addition, the DBR layer 130 acting as a reflective mirror is placed under the pad electrode 165 of the second electrode such that light reflected by the electrode can be reflected again, thereby improving light extraction efficiency.

Figure 5:
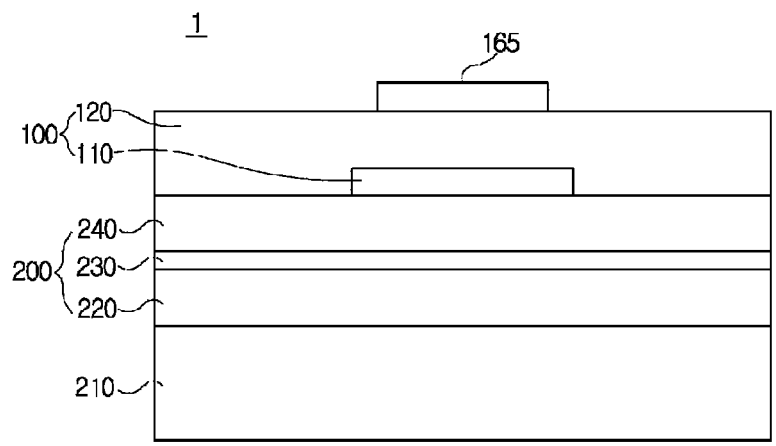
FIG. 5 is a sectional view of a light emitting diode according to a third embodiment of the present invention.

FIG. 5 is a sectional view of a light emitting diode according to a third embodiment of the present invention. Herein, FIGS. 1 and 2 will also be referred to in description of the light emitting diode according to this embodiment.

Referring to FIG. 5, unlike the above embodiments, in the light emitting diode according to this embodiment, the first transparent conductive layer 110 and the second transparent conductive layer 120 have different electrical conductivities. In other words, the second transparent conductive layer 120 has higher electrical conductivity than the first transparent conductive layer 110. Here, the first transparent conductive layer 110 may be formed to have the same or slightly larger size than the pad electrode 163 of the second electrode.

When electric current is supplied through the pad electrode 163 of the second electrode, current crowding can occur under the pad electrode. Accordingly, the first transparent conductive layer 110 having relatively low electrical conductivity, that is, high resistance, causes the electric current to spread to areas other than the area in which the first transparent conductive layer 110 is formed.

In other words, the electric current smoothly flows in the second transparent conductive layer 120 while being blocked to flow around the first transparent conductive layer 110 having relatively low electrical conductivity, whereby current spreading can occur in a horizontal direction (plane direction) of the second transparent conductive layer 120. This structure provides a current blocking layer (CBL) effect that allows uniform current spreading around the first transparent conductive layer 110.

Accordingly, the light emitting diode allows the electric current to evenly spread in the plane direction in the second semiconductor layer 240 in which current crowding can occur, whereby the amount of electric current supplied to the semiconductor stack 200 can be increased, thereby improving luminous efficacy of the light emitting diode 1.

In order to increase electrical conductivity of the second transparent conductive layer 120, impurities composed of the same kind of material as the first transparent conductive layer 110 and capable of increasing electrical conductivity may be implanted.

The impurities may include Group I elements including Li, Na, K, and Cu, and Group V elements including N, P, As, Bi, and Sb.

Alternatively, the impurities may include Group III elements including Al, Ga, In, and B, and Group VII elements including F, Cl, and Mn.

Alternatively, the impurities may include compounds including at least two of Group I, III, V and VII elements.

In this way, the electrical conductivities of the first and second transparent conductive layers are changed such that the second transparent conductive layer 120 has relatively high electrical conductivity and the first transparent conductive layer 110 has relatively low electrical conductivity to secure current spreading, thereby allowing electric current to spread evenly in the second semiconductor layer 240.

Figure 6:
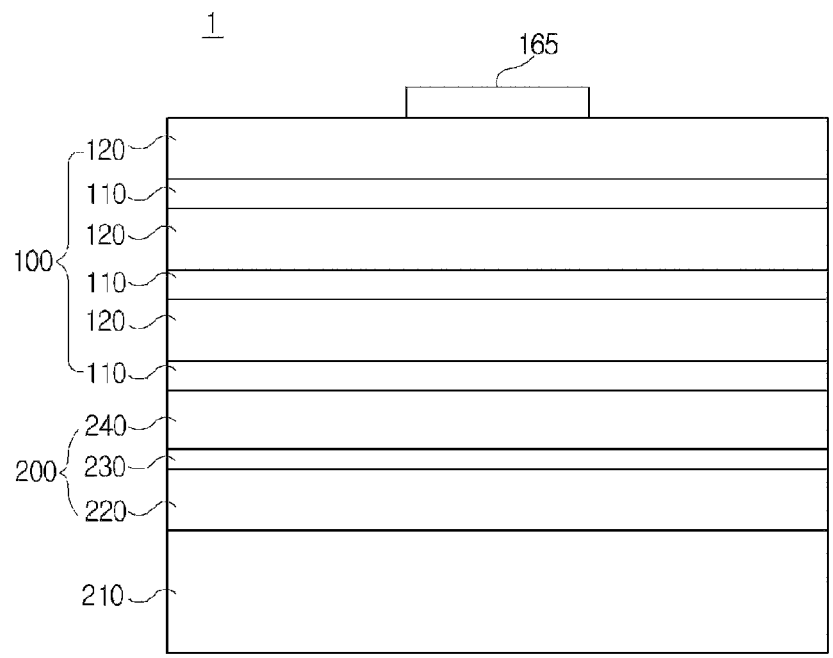
FIG. 6 is a sectional view of a light emitting diode according to a fourth embodiment of the present invention.

FIG. 6 is a sectional view of a light emitting diode according to a fourth embodiment of the present invention. Herein, FIGS. 1 and 2 will also be referred to in description of the light emitting diode according to this embodiment.

Referring to FIG. 6, unlike the above embodiments, in the light emitting diode according to this embodiment, the first transparent conductive layer 110 and the second transparent conductive layer 120 having different electrical conductivities from the first transparent conductive layer 110 are alternately stacked one above another. In other words, the first transparent conductive layer 110 and the second transparent conductive layer 120, which is formed of a compound prepared by adding a heterogeneous material to a material of the first transparent conductive layer 110, are alternately stacked one above another.

Here, the second transparent conductive layer 120 formed of the compound prepared by adding the heterogeneous material to the material of the first transparent conductive layer may be formed to have higher electrical conductivity than the first transparent conductive layer 110. Alternatively, the second transparent conductive layer 120 formed of the compound prepared by adding the heterogeneous material to the material of the first transparent conductive layer may be formed to have lower electrical conductivity than the first transparent conductive layer 110.

The second transparent conductive layer may be formed to have a large band gap using an additive having a lower atomic number than zinc (Zn) as the heterogeneous material. Alternatively, the second transparent conductive layer may be formed to have a small band gap using an additive having a higher atomic number than zinc (Zn) as the heterogeneous material. For example, magnesium (Mg) may be used as the additive such that the second transparent conductive layer has large band gap, and cadmium (Cd) may be used as the additive such that the second transparent conductive layer has small band gap.

As such, the additive may include at least one selected from the group consisting of Group II elements including Mg, Ca, Be and Cd, and compounds thereof, which can adjust the energy band gap of the same kind of material as the homogeneous material. Alternatively, the additive may include at least one selected from the group consisting of Group VI elements including Cr, Mo, W, Se and Te, and compounds thereof.

In this way, the layers having different electrical conductivities are alternately stacked to form a stack, so that a high resistance layer (a layer having low electrical conductivity) can act as a barrier layer. Accordingly, in the barrier layer having a large energy band gap, electrical current spreads in the plane direction instead of directly flowing though the barrier layer. Then, when electric current is accumulated in the barrier layer, conduction of electric current occurs therethrough.

As such, the first transparent conductive layer 110 formed to have relatively low electrical conductivity to provide low energy band gap and the second transparent conductive layer 120 formed to have high energy band gap, or vice versa are alternately stacked one above another, thereby facilitating lateral current spreading in the transparent conductive layer 100.

As the electric current laterally spreads in the transparent conductive layer 100, it is possible to allow the electric current to spread evenly in the second semiconductor layer 240, which adjoins a lower side of the transparent conductive layer. As such, the electric current spreads evenly in the second semiconductor layer 240, thereby improving luminous efficacy of the light emitting diode 1.

Figure 7A:
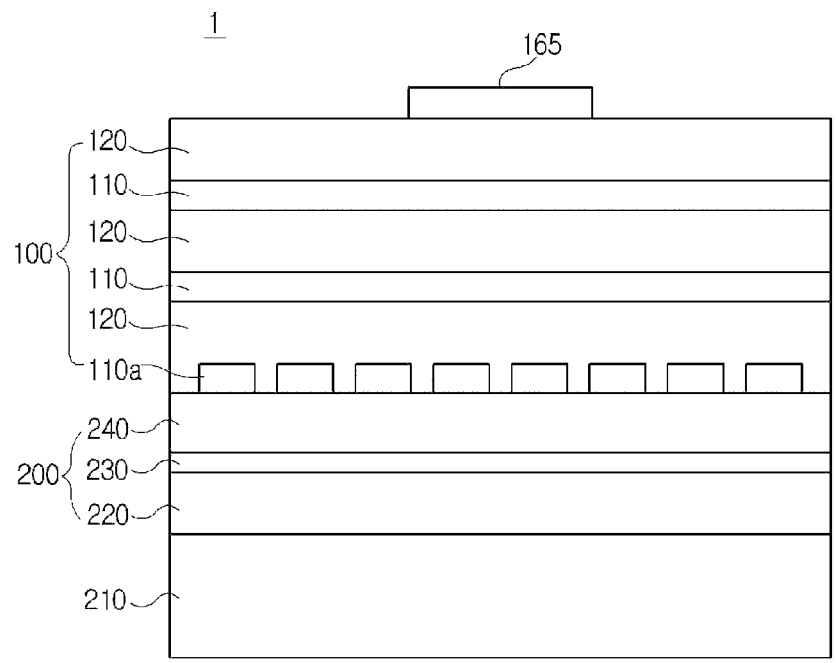
FIG. 7a and FIG. 7b are sectional views of a light emitting diode according to a fifth embodiment of the present invention.
Figure 7B:
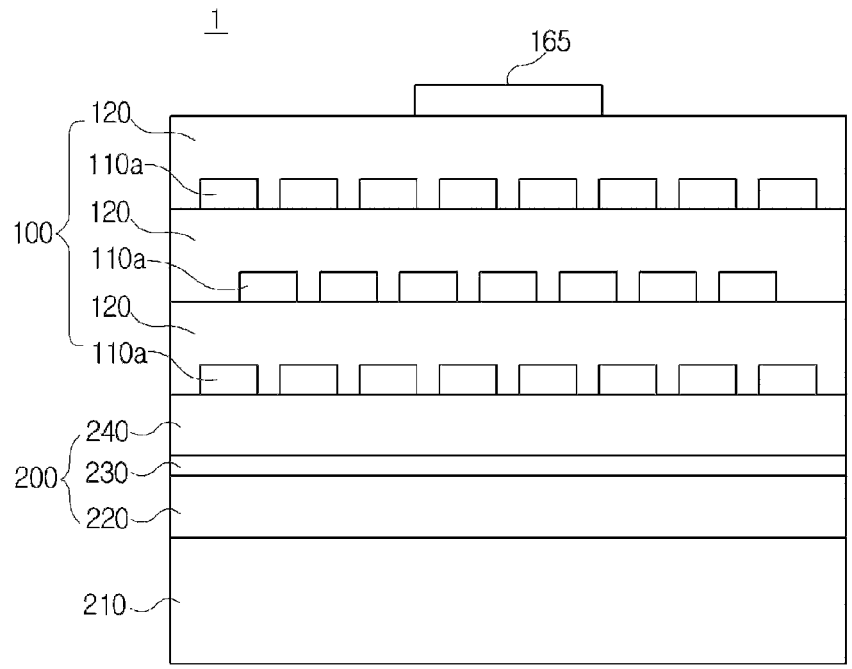

FIG. 7a and FIG. 7b are sectional views of a light emitting diode according to a fifth embodiment of the present invention. Herein, FIGS. 3 and 4 will also be referred to in description of the light emitting diode according to this embodiment.

Referring to FIG. 7a and FIG. 7b, the transparent conductive layer 100 may be formed to have a combined structure of the structure according to the first embodiment (see FIG. 3) and the structure according to the fourth embodiment (see FIG. 6). In order to facilitate current spreading, the transparent conductive layer 100 is patterned to have a first transparent conductive layer 110a, which adjoins the second semiconductor layer 240, as in the first embodiment (see FIG. 2). Here, the first transparent conductive layer 110a has higher electrical conductivity than the second transparent conductive layer 120.

In addition, electric current tends to flow through a low resistance area. Thus, electric current tends to flow to the first transparent conductive layer 110a instead of the second semiconductor layer 240 having relatively high resistance, so that the electric current flows along the first transparent conductive layer 110a which is evenly distributed. That is, the electric current flows to the first transparent conductive layer 110a. Accordingly, the electric current spreads in the plane direction of the first transparent conductive layer 110a and is then delivered to the second semiconductor layer 240. That is, the light emitting diode according to this embodiment has improved luminous efficacy by allowing uniform spreading of electric current.

Furthermore, the first transparent conductive layer 110 and the second transparent conductive layer 120 are repeatedly formed to allow current spreading as in the fourth embodiment (see FIG. 6).

Referring again to FIG. 7b, the patterned first transparent conductive layer 110a may be formed not only on the second semiconductor layer 240 but also on the second transparent conductive layer 120. Here, the patterned first transparent conductive layer 110a may be alternately arranged with the first transparent conductive layer 110a placed on a lower side of the second transparent conductive layer 120, thereby further improving current spreading effects.

As such, as electric current spreads laterally in the transparent conductive layer 100, it is possible to supply the spreading electric current to the second semiconductor layer 240 adjoining the lower side of the transparent conductive layer. In this way, the light emitting diode 1 can have improved luminous efficacy by supplying the spreading electric current to the second semiconductor layer 240.

Figure 8:
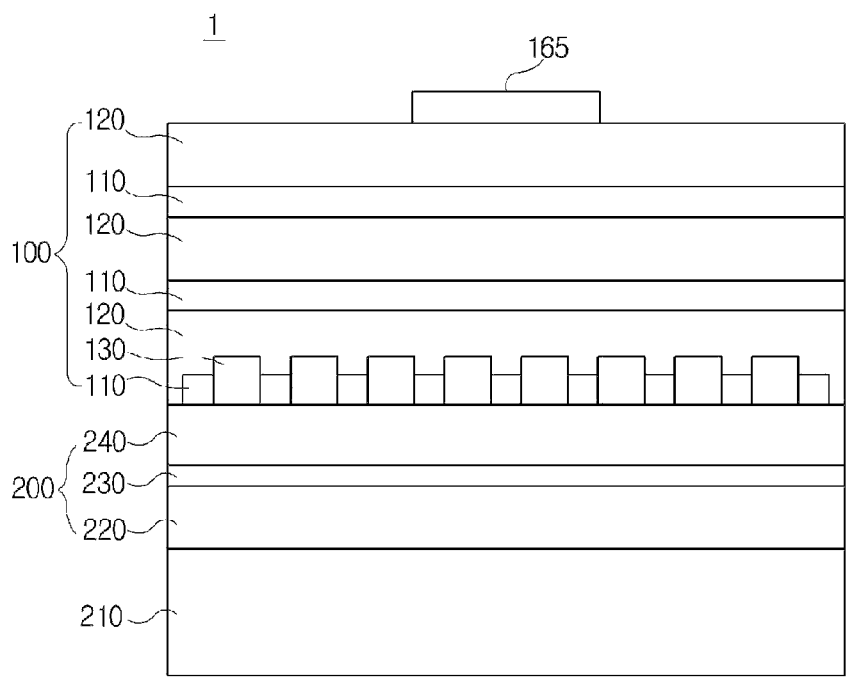
FIG. 8 is a sectional view of a light emitting diode according to a sixth embodiment of the present invention.

FIG. 8 is a sectional view of a light emitting diode according to a sixth embodiment of the present invention. Herein, FIGS. 3, 4 and 6 will also be referred to in description of the light emitting diode according to this embodiment.

Referring to FIG. 8, the transparent conductive layer 100 may be formed to have a combined structure of the structure according to the second embodiment (see FIGS. 3 and 4) and the structure according to the fourth embodiment (see FIG. 6).

The transparent conductive layer 110 may be patterned on the second semiconductor layer 240 to form an electrically conductive area EA having the first transparent conductive layer 110 therein and a resistive area RA through which the second semiconductor layer 240 is exposed.

In this embodiment, a DBR layer 130 may be formed in the resistive area RA. To avoid repeated description, the DBR layer will be described with reference to the second embodiment. With the DBR layer 130 having a reflective structure, the light emitting diode 1 can have improved light extraction efficiency.

Further, as in the fourth embodiment of the invention, the first transparent conductive layer 110 and the second transparent conductive layer 120 are repeatedly stacked one above another to allow uniform current spreading in the first transparent conductive layer 110 such that the spread electric current can be uniformly delivered to the second semiconductor layer 240, thereby improving luminous efficacy of the light emitting diode 1.

Figure 9:
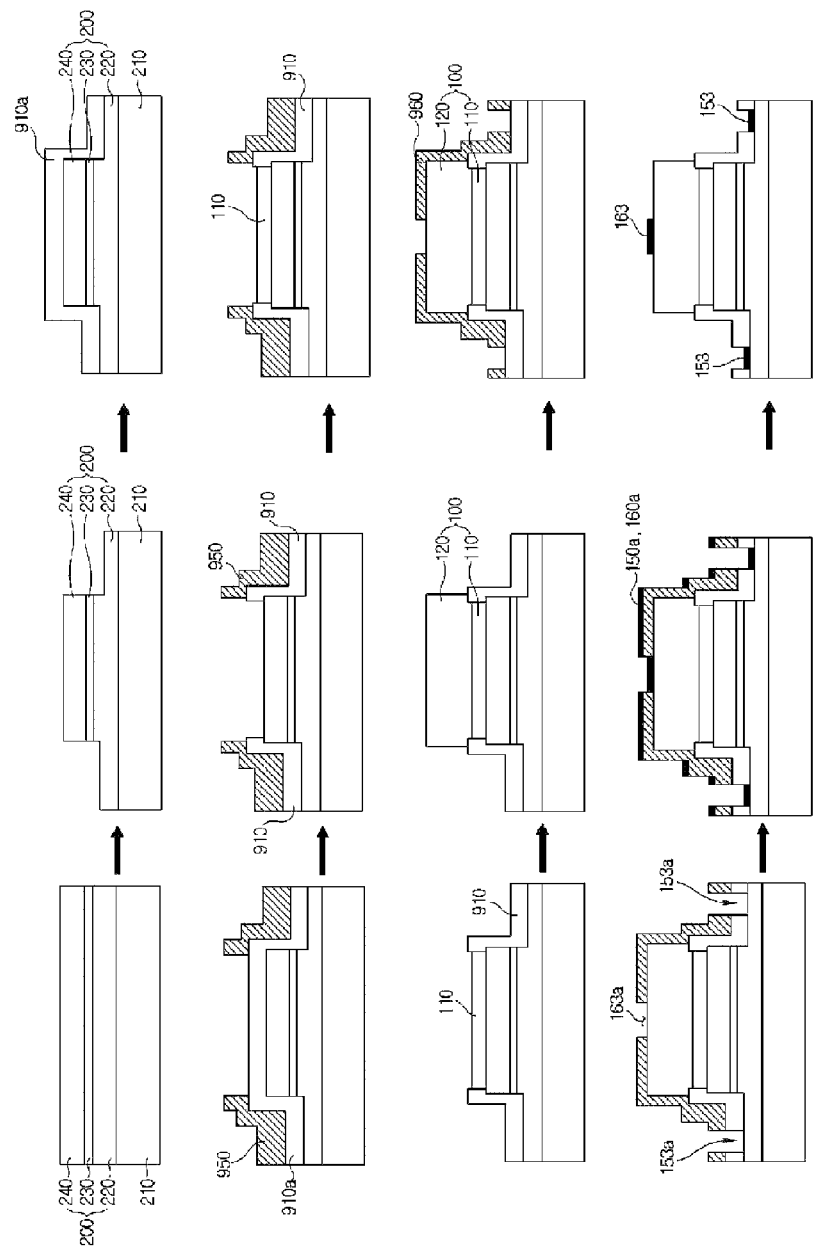
FIG. 9 shows sectional views illustrating a method for manufacturing a light emitting diode according to the present invention.
Figure 10:
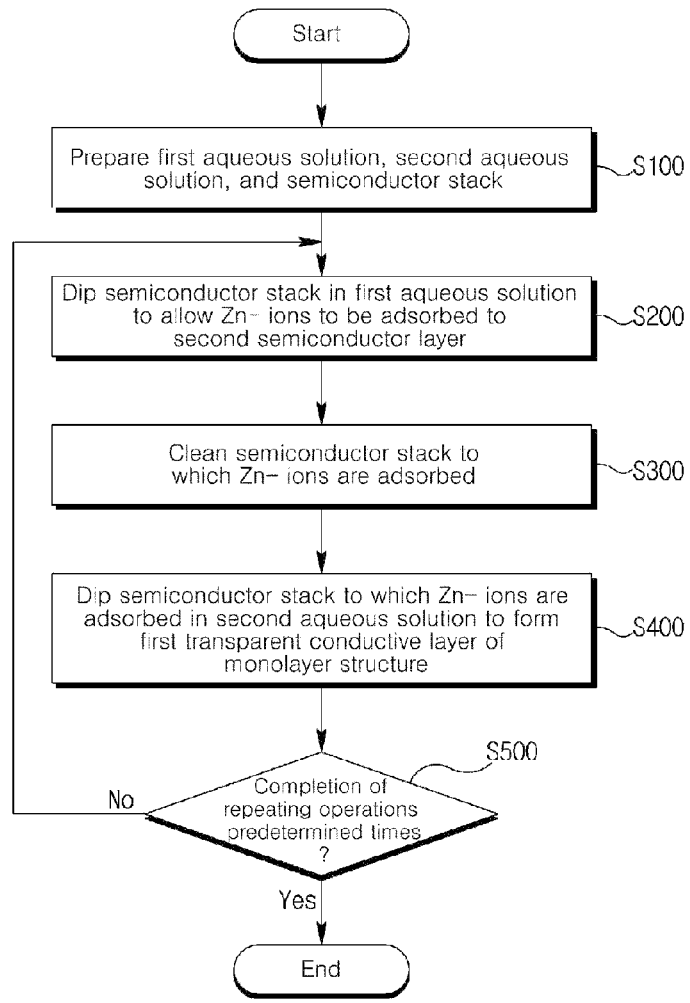
FIG. 10 is a flowchart illustrating a process of forming a first transparent conductive layer of the light emitting diode according to the present invention.
Figure 11:
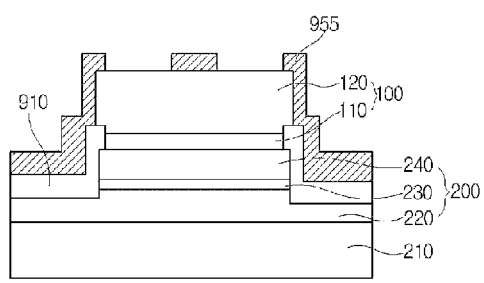
FIG. 11 and FIG. 12 are sectional views illustrating a process of performing surface treatment of a transparent conductive layer for improving light extraction efficiency of the light emitting diode according to the present invention.
Figure 12:
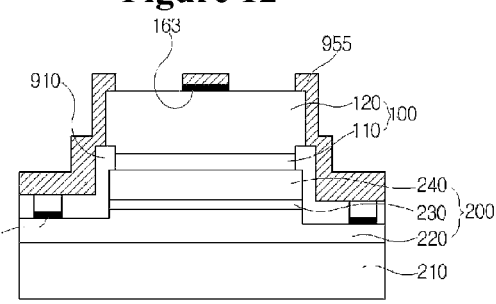

FIG. 9 shows sectional views illustrating a method for manufacturing a light emitting diode according to the present invention, FIG. 10 is a flowchart illustrating a process of forming a first transparent conductive layer of the light emitting diode according to the present invention, and FIG. 11 and FIG. 12 are sectional views illustrating a process of performing surface treatment of a transparent conductive layer for improving light extraction efficiency of the light emitting diode according to the present invention. To avoid a repeated description, FIG. 1 to FIG. 8 will also be referred to in the following description. FIG. 9 is a sectional view taken along line B-B' of FIG. 1.

As shown in FIG. 9, first, a semiconductor stack 200 is formed on a substrate 210. The semiconductor stack 200 may be formed by stacking nitride semiconductors. The semiconductor stack 200 may be formed by sequentially stacking a first semiconductor layer 220, an active layer 230, and a second semiconductor layer 240. Here, the first transparent conductive layer 220 may be an n-type semiconductor layer and the second transparent semiconductor layer 240 may be a p-type semiconductor layer, or vice versa.

Next, a mesa structure is formed by mesa-etching the semiconductor stack 200 such that the first semiconductor layer 220 is exposed through the mesa structure.

Next, a passivation process is performed to protect the semiconductor stack 200 having the mesa structure. A passivation layer 910a may be formed of $SiO_2$, which is transparent and exhibits insulation properties.

Next, a photoresist (PR) 950 is applied to the semiconductor stack 200 on which the passivation layer 910a is formed, followed by development to expose the passivation layer 910a placed on a region of the second semiconductor layer 240. Then, the exposed passivation layer 910a is subjected to etching to expose the second semiconductor layer 240.

Here, an upper surface of the second semiconductor layer 240 may be entirely exposed or partially exposed.

Next, a first transparent conductive layer 110 is formed on the exposed surface of the second semiconductor layer 240. The first transparent conductive layer 110 may be formed by hydrothermal synthesis.

Referring to FIG. 10, a first aqueous solution, a second aqueous solution and a semiconductor stack are prepared in S100. To prepare the first aqueous solution, powder containing zinc (Zn) and a liquid solution capable of dissolving the powder are prepared. The liquid solution may be an aqueous solution containing chlorine (Cl) and nitrogen (N). Then, the first aqueous solution is prepared by dissolving the Zn-containing powder in the liquid solution.

As the second aqueous solution, deionized (DI) water is prepared. The DI water refers to pure water from which foreign matter including dissolved ions is completely removed except for ions generated from water.

In S200, the semiconductor stack including a second semiconductor layer in an exposed state is dipped in the first aqueous solution such that $Zn^-$ ions can be adhered to a surface of the second semiconductor layer.

In S300, the semiconductor stack to which Zn⁻ ions are adhered is subjected to cleaning. Here, cleaning may be performed using hot DI water.

Next, in S400, the semiconductor stack to which Zn⁻ ions are adhered is dipped in the second aqueous solution to form a first transparent conductive layer of a monolayer structure formed of ZnO through supply of oxygen. The monolayer structure may be formed by atomic layer deposition.

Then, operations S100 to S400 may be repeated in order to obtain a desired thickness of the first transparent conductive layer having the monolayer structure. The first transparent conductive layer may be formed to a predetermined thickness by repeating these operations.

Referring again to FIG. 9, heat treatment is performed after removing the photoresist 950 from the semiconductor stack on which the first transparent conductive layer is formed.

Heat treatment may be performed at 500° C. under a nitrogen atmosphere. By heat treatment, ohmic contact between the first transparent conductive layer 110 and the second semiconductor layer 240 can be obtained.

On the other hand, as in the first embodiment (see FIG. 3), the first transparent conductive layer 110 may be subjected to patterning. Patterning of the first transparent conductive layer 110 may be performed through a photoresist process. Current spreading can be easily achieved through the patterned first transparent conductive layer 110.

On the other hand, as in the second embodiment (see FIGS. 4a and 4b), a DBR layer 130 may be further formed in an exposed region of the second semiconductor layer 240 formed by patterning the first transparent conductive layer 110. The DBR layer 130 may act as a reflective mirror that reflects light, which has been emitted from active layer 230 and returned to the active layer, thereby improving light extraction efficiency of the light emitting diode 1.

Referring again to FIG. 9, a second transparent conductive layer 120 is grown on the first transparent conductive layer 110. The first transparent conductive layer 110 may act as a nucleus layer for growing the second transparent conductive layer 120. Here, the second transparent conductive layer 120 may be grown in a reactor furnace. Further, as in the first, second and third embodiments (see FIG. 3, FIG. 4a, and FIG. 5), the patterned first transparent conductive layer 110 is grown by epitaxial lateral overgrowth to form a high quality second transparent conductive layer 120.

On the other hand, as shown in FIG. 11, before forming electrodes on the semiconductor stack, an upper surface of the second transparent conductive layer 120 excluding an area in which the electrodes will be formed is subjected to surface treatment to improve light extraction efficiency.

The surface treatment may be performed after patterning using a photoresist 955. The surface treatment of the second transparent conductive layer forms a shape similar to a hexagonal close-packed structure of ZnO on the surface thereof, thereby improving light extraction efficiency.

Referring again to FIG. 9, a photoresist 960 is applied to the second transparent conductive layer 120 formed on the semiconductor stack 200, followed by development to expose areas on which first and second electrodes 150, 160 will be formed.

The second electrode 160 may be formed on the exposed area of the second transparent conductive layer 120 and the first electrode 150 may be formed on the exposed area of the first semiconductor layer 220. Here, since the passivation layer 910 is formed on the first semiconductor layer, the first semiconductor layer 220 may be exposed by etching the passivation layer 910. In this way, electrode areas 153a, 163a on which the second electrodes will be formed may be formed. Here, the electrode areas correspond to areas in which elongated electrodes will be formed.

Next, electrode materials 150a, 160a are deposited onto the photoresist 960 and the electrode areas 153a, 163a of the semiconductor stack.

Next, when the photoresist is removed from the semiconductor stack, a first elongated electrode 153 and a second elongated electrode 163 are formed on the first semiconductor layer 220 and the second transparent conductive layer 120, respectively. Here, the first electrode and the second electrode may be individually formed through application, etching, and deposition.

In this way, the first and second electrodes are formed, thereby manufacturing a light emitting diode having improved light extraction efficiency and current spreading effects.

On the other hand, in order to improve light extraction efficiency, as shown in FIG. 12, a photoresist 955 is applied to the semiconductor stack having the electrodes formed thereon, followed by development and surface treatment of the first transparent conductive layer. Here, since only an upper surface of the first transparent conductive layer is subjected to surface treatment, other areas of the first transparent conductive layer may be protected by the photoresist. Since ZnO can maintain transparency irrespective of thickness thereof, surface treatment of the second transparent conductive layer having a thick thickness can improve light extraction efficiency.

In this way, the first transparent conductive layer and the second transparent conductive layer of the transparent conductive layer are grown under different atmospheres, whereby a high quality transparent conductive layer can be formed. In addition, the embodiments of the present invention provide a method for manufacturing a light emitting diode in which the transparent conductive layer is composed of plural layers having different electrical conductivities to improve luminous efficacy through current spreading.

The invention claimed is:

1. A light emitting diode, comprising:
   a semiconductor stack comprising a first semiconductor layer, an active layer, and a second semiconductor layer; and
   a transparent conductive layer comprising a first transparent conductive layer disposed on the second semiconductor layer and a second transparent conductive layer disposed on the first transparent conductive layer, the second transparent conductive layer having a different electrical conductivity than the first transparent conductive layer,
   wherein the first and second transparent conductive layers comprise zinc oxide, and
   wherein the transparent conductive layer further comprises:
   a first area where the first transparent conductive layer and the second semiconductor layer directly contact each other; and
   a second area where the second transparent conductive layer and the second semiconductor layer contact each other and having less conductivity than the first area.

2. The light emitting diode of claim 1, further comprising:
   a first electrode connected to the first semiconductor layer; and
   a second electrode disposed on the second transparent conductive layer.

3. The light emitting diode of claim 1, wherein the first transparent conductive layer and the second transparent conductive layer have different thicknesses.

4. A light emitting diode, comprising:
   a semiconductor stack comprising a first semiconductor layer, an active layer, and a second semiconductor layer; and
   a transparent conductive layer comprising a first transparent conductive layer disposed on the second semiconductor layer and a second transparent conductive layer disposed on the first transparent conductive layer, the second transparent conductive layer having a different electrical conductivity than the first transparent conductive layer,
   wherein the first and second transparent conductive layers comprise zinc oxide, and wherein the transparent conductive layer comprises:
      a first area where the first transparent conductive layer and the second semiconductor layer directly contact each other; and
      a second area, being less conductive than the first area, comprising a distributed Bragg reflector (DBR) layer interposed between the second transparent conductive layer and the second semiconductor layer without the first transparent conductive layer therebetween.

5. The light emitting diode of claim 4, wherein the DBR layer is formed by alternately stacking two materials having different indices of refraction, and the DBR layer comprises at least one material selected from the group consisting of $SiO_x$, $SiN_x$, $Si_xN_y$, $SiON_x$, $SiO_2$, $TiO_2$, $Nb_2O_5$, and $HfO_2$.

6. The light emitting diode of claim 4, wherein the DBR layer comprises at least one shape selected from the group consisting of a hexagonal shape, an octagonal shape, and a circular shape.

7. The light emitting diode of claim 4, wherein the DBR layer is disposed below a lower side of the second electrode.

8. A light emitting diode, comprising:
   a semiconductor stack comprising a first semiconductor layer, an active layer, and a second semiconductor layer; and
   a transparent conductive layer comprising a first transparent conductive layer disposed on the second semiconductor layer and a second transparent conductive layer disposed on the first transparent conductive layer, the second transparent conductive layer having a different electrical conductivity than the first transparent conductive layer,
   wherein:
      the second transparent conductive layer is disposed on the first transparent conductive layer, the second transparent conductive layer comprises a first material of zinc oxide and a second material,
      the first transparent conductive layer comprises the first material, and
      the first transparent conductive layer comprises multiple first transparent conductive layers, and the second transparent conductive layer comprises multiple second transparent conductive layers
      the second material is a heterogeneous material that comprises at least one element selected from the group consisting of Mg, Ca, Be, and Cd, and
      the second material is configured to adjust an energy band gap of the second transparent conductive layer.

9. A light emitting diode, comprising:
   a semiconductor stack comprising a first semiconductor layer, an active layer, and a second semiconductor layer; and
   a transparent conductive layer comprising a first transparent conductive layer disposed on the second semiconductor layer and a second transparent conductive layer disposed on the first transparent conductive layer, the second transparent conductive layer having a different electrical conductivity than the first transparent conductive layer,
   wherein:
      the second transparent conductive layer is disposed on the first transparent conductive layer, the second transparent conductive layer comprises a first material of zinc oxide and a second material,
      the first transparent conductive layer comprises the first material,
      the first transparent conductive layer comprises multiple first transparent conductive layers, and the second transparent conductive layer comprises multiple second transparent conductive layers,
      the second material is a heterogeneous material that comprises at least one element selected from the group consisting of Cr, Mo, W, Se and Te, and
      the second material is configured to adjust an energy band gap of the second transparent conductive layer.

* * * * *